(12) United States Patent
Sagen et al.

(10) Patent No.: US 7,545,021 B1
(45) Date of Patent: Jun. 9, 2009

(54) APPARATUS AND METHOD FOR MAKING INTEGRATED CIRCUIT PACKAGES HAVING INTEGRATED CIRCUITS MOUNTED ONTO PASSIVE ELECTRICAL COMPONENTS

(75) Inventors: Eric Anthony Sagen, Longmont, CO (US); James T. Doyle, Nederland, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 382 days.

(21) Appl. No.: 11/182,227

(22) Filed: Jul. 14, 2005

(51) Int. Cl.
*H01L 23/02* (2006.01)

(52) U.S. Cl. ............ 257/531; 257/678; 257/E21.022

(58) Field of Classification Search ............ 257/678, 257/531, 706, 707; 438/122
See application file for complete search history.

(56) References Cited

U.S. PATENT DOCUMENTS

| | | | | |
|---|---|---|---|---|
| 5,402,321 | A * | 3/1995 | Izu et al. ............ | 361/807 |
| 5,959,846 | A * | 9/1999 | Noguchi et al. ......... | 361/782 |
| 6,392,523 | B1 * | 5/2002 | Tsunemi ............ | 336/192 |
| 6,541,948 | B1 | 4/2003 | Wong | |
| 6,586,309 | B1 | 7/2003 | Yeo et al. | |
| 6,744,114 | B2 | 6/2004 | Dentry et al. | |
| 6,759,746 | B1 | 7/2004 | Davies | |
| 6,771,156 | B2 * | 8/2004 | Chou ............ | 336/83 |
| 6,778,058 | B1 | 8/2004 | Branchevsky | |
| 6,833,781 | B1 | 12/2004 | Padmanabhan et al. | |
| 6,916,688 | B1 * | 7/2005 | Kelkar et al. ............ | 438/122 |
| 7,154,174 | B2 * | 12/2006 | Maxwell ............ | 257/707 |
| 7,177,436 | B2 * | 2/2007 | Frieding et al. ............ | 381/331 |

OTHER PUBLICATIONS

Chandler et al., "*Novel High Power Ferrite Inductor Design with Improved Design Accuracy and Overall Performance,*" IEEE 32nd Annual Power Electronics Specialists Conference, 2001, pp. 2090-2094.
Enpirion, "*EN5310 1A Voltage Mode Synchronous Buck PWN DC-DC Converter,*" Product Information Brochure, Rev. 0.92 Preliminary, Jan. 2005, 10 pages.
Ferroxcube, "*Miniature Drum Cores for Power Inductors,*" Product Information Brochure, Released Jun. 2002, 4 pages.
Globalspec, "*About IC Switching Voltage Regulators,*" download from http://semiconductors.globalspec.com/LearnMore/Semiconductors/Power_Management_Chips/ IC_Switching_Voltage_Regulators, downloaded on Apr. 29, 2005. 3 Pages.
National Semiconductor Corporation, "*Micro SMD Wafer Level Chip Scale Package,*" Product Information (AN-1112), Dec. 2004, 10 Pages.
Philips, "*Integrated Inductive Components, Ready to come on board,*" Product Information Brochure, Released Jul. 1999, 6 pages.

(Continued)

*Primary Examiner*—Michael Trinh
(74) *Attorney, Agent, or Firm*—Beyer Law Group LLP

(57) ABSTRACT

Semiconductor package assemblies having integrated circuits mounted onto passive electrical components. The assemblies each include an inductor having a magnetic core and an wire wrapped around the magnetic core. An integrated circuit die is positioned either on or within a recess formed in the magnetic core of the inductor. Electrical traces are formed on the magnetic core. The electrical traces are configured to electrically couple the inductive wire of the inductor with the integrated circuit die positioned on or recessed within the inductor.

21 Claims, 6 Drawing Sheets

OTHER PUBLICATIONS

Wanior, "*Inductive Components and Appropriate Magnetic materials for Filters in SMPS-designs*," ICIT'03 International Conference on Industrial Technology, ICIT'03 Maribor, Slovenia, Dec. 10-12, 2003, pp. 1178-1183.

U.S. Appl. No. 10/968,662, filed Oct. 18, 2004.
U.S. Appl. No. 10/884,597, filed Jul. 2, 2004.
U.S. Appl. No. 10/861,563, filed Jun. 4, 2004.
U.S. Appl. No. 11/137,767, filed May 25, 2005.
U.S. Appl. No. 10/853,873, filed May 26, 2004.
U.S. Appl. No. 10/980,679, filed Nov. 3, 2004.

* cited by examiner

APPARATUS AND METHOD FOR MAKING INTEGRATED CIRCUIT PACKAGES HAVING INTEGRATED CIRCUITS MOUNTED ONTO PASSIVE ELECTRICAL COMPONENTS

FIELD OF THE INVENTION

The present invention relates generally to the packaging of semiconductor integrated circuits, and more particularly, to an apparatus and method for creating semiconductor chip packages including integrated circuits mounted directly onto passive electrical components, such as capacitors, inductors, resistors and the like.

BACKGROUND

Semiconductor dice are typically fabricated in wafer form. A silicon wafer undergoes a series of well known processing steps to fabricate a plurality of dice on the wafer. After fabrication, the individual dice are separated by cutting or sawing the wafer along the scribe lines. The individual dice are then usually encapsulated in a package. Common types of chip packages used in the semiconductor industry include, but are not limited to, dual in-line packages (DIPs), leadless lead frame packages, bumped die packages, ball grid array packages, etc.

Most, if not all semiconductor chips, regardless of their functionality, require some type of passive component, such as resistors, capacitors, inductors, or transformers, for proper operation. For example, analog and power linear power regulator chips will typically rely on some type of filter capacitors. The filter capacitors store charge which helps the power regulator maintain a steady voltage supply. Similarly, high speed digital circuits require highly regulated line voltages. To create the proper line voltage, sophisticated capacitor filter networks are used to provide the needed steady power supply for the digital circuitry to properly operate at the high clock frequencies. Accordingly, most chips rely on some sort of filter capacitor(s) to provide regulated line voltage for operation. Many integrated circuits rely on resistors for a whole host of reasons, such as pull up resistors, voltage dividers, etc. For example, battery powered devices using high speed digital circuits typically require several different voltages to be created from the battery. Very often switching voltage regulators/converters use inductors and/or capacitors as energy storage devices for the voltage levels.

Chip and system designers have developed several methods for providing both analog and digital circuitry with access to the needed passive components.

One known method is to fabricate the passive component directly on the die along with the other circuitry on the chip. For example, resistors and capacitors can be fabricated using thin films and dielectrics deposited or formed directly on the die. The problem with this technique, however, is that the size of the resistors and capacitors is limited. The die itself is typically small. Also a large portion of the surface area on the die is often dedicated to other circuitry. The resistive and capacitive values that can be achieved by fabricating resistors and capacitors on the die are therefore relatively small.

Another approach is to mount the passive element on a circuit board adjacent the chip. Electrical traces on the board connect the leads of the passive element to the appropriate pins or contacts on the chip. The issue with using external passive elements is that they occupy a large amount of surface area on the printed circuit board. This is particularly problematic with many small sized, high volume, consumer electronic devices, such as cell phones, MP3 players, personal digital assistants, etc. The addition of the external passive components on the boards places a constraint on how small these consumer devices can be made.

Yet another solution is to fabricate the passive components within the various layers of the printed circuit boards the chip is to be mounted on. For example, thin film resistors, dielectric layers, and the like, may be formed on the various layers of the printed circuit board to form the resistors and capacitors. Metal traces and vias are then used connect the passive component to the pins or contacts of the integrated circuit package mounted onto the board. The problem with this approach is that it is inefficient. Relatively large amounts of surface area on the printed circuit board are usually required to create the resistors, capacitors and inductors. Accordingly, forming the passive elements on printed circuit boards is problematic for many applications, such as cell phones, PDAs, MP3 players and other mobile or small devices where space is at a premium and the smaller the printed circuit board the better.

Since many chips require passive components with resistance, capacitance, and/or inductance values that are simply too large to be implemented either on chip or embedded within the layers of a printed circuit board, the only practical solution thus far has been to mount a separate passive components adjacent the chip onto the board.

The term "form factor" is generally used in the semiconductor industry to refer to passive components that are approximately the same size or slightly larger than the chips that use the passive components. In many applications, the chips and their requisite form factor passive components are mounted side by side on the board. As previously noted, this arrangement tends to occupy a great deal of space on the board, which can become problematic, particularly with small and/or portable consumer devices, such as cell phones, PDAs, MP3 players, and other small sized devices. Thus fitting a printed circuit board populated with semiconductor chip packages and their needed passive components into a small consumer device, such as an MP3 player or cell phone, has become a significant challenge.

An apparatus and method for making semiconductor packages having integrated circuits mounted onto passive electrical components is therefore needed.

SUMMARY OF THE INVENTION

An apparatus and method for making semiconductor packages having integrated circuits mounted onto passive electrical components is disclosed. The apparatus includes an inductor having a magnetic core and an inductive wire wrapped around the magnetic core. An integrated circuit die is positioned on top of or within a recess formed within the magnetic core of the inductor. Electrical traces are formed on the magnetic core. The electrical traces are configured to electrically couple the inductive wire of the inductor with the integrated circuit die positioned within the recess of the inductor. The electrical traces are also used to provide coupling of the integrated circuit and inductor to a circuit board.

BRIEF DESCRIPTION OF THE DRAWINGS

The invention, together with further advantages thereof, may best be understood by reference to the following description taken in conjunction with the accompanying drawings in which.

Like references numbers refer to like elements in the detailed description of the invention.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

Figure 1:
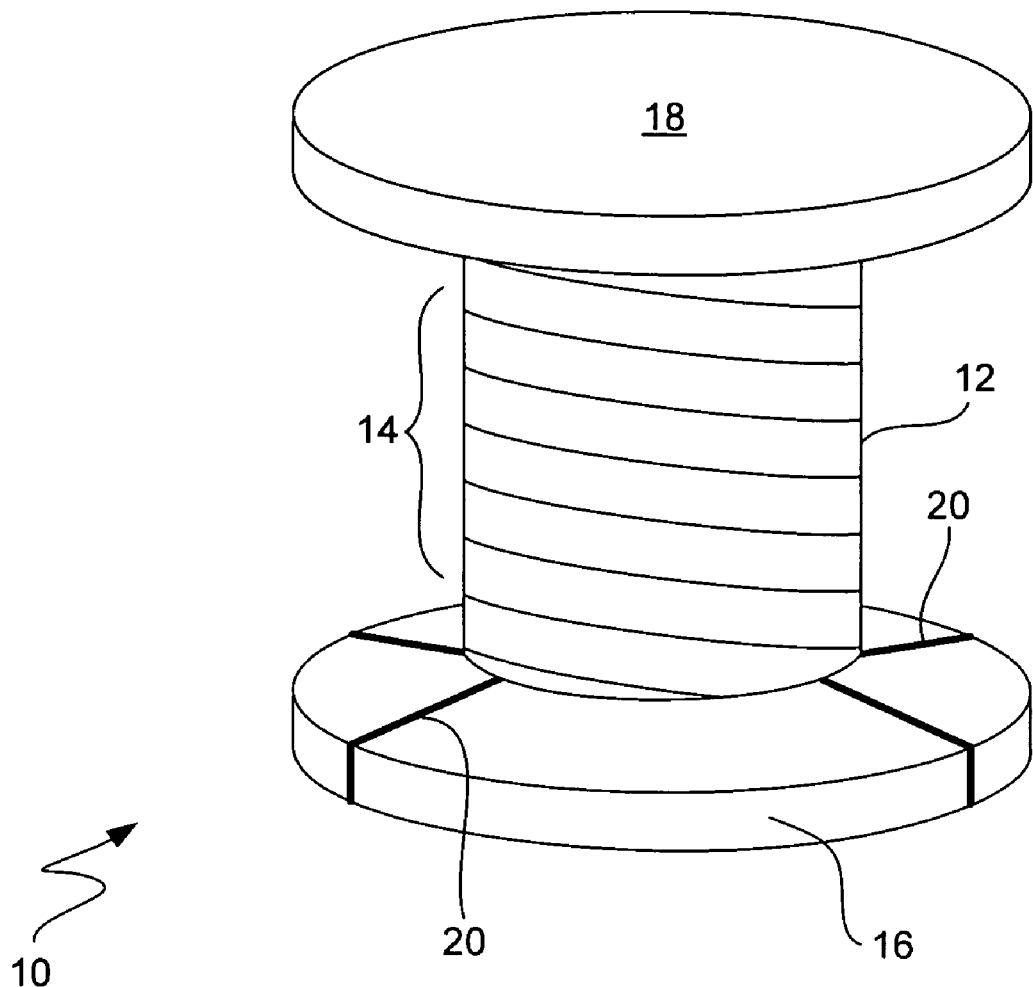
FIG. 1 is a first view of an inductor according to the present invention.

Referring to FIG. 1, a first view of an inductor according to the present invention is shown. The inductor 10 includes a magnetic core 12 and a wire 14 wrapped around the magnetic core 12. The inductor 10 also includes a bottom base 16 and a top surface 18. A number of traces 20 are provided on the base for providing electrical contact to the wire 14 wrapped around the magnetic core 12.

Figure 2:
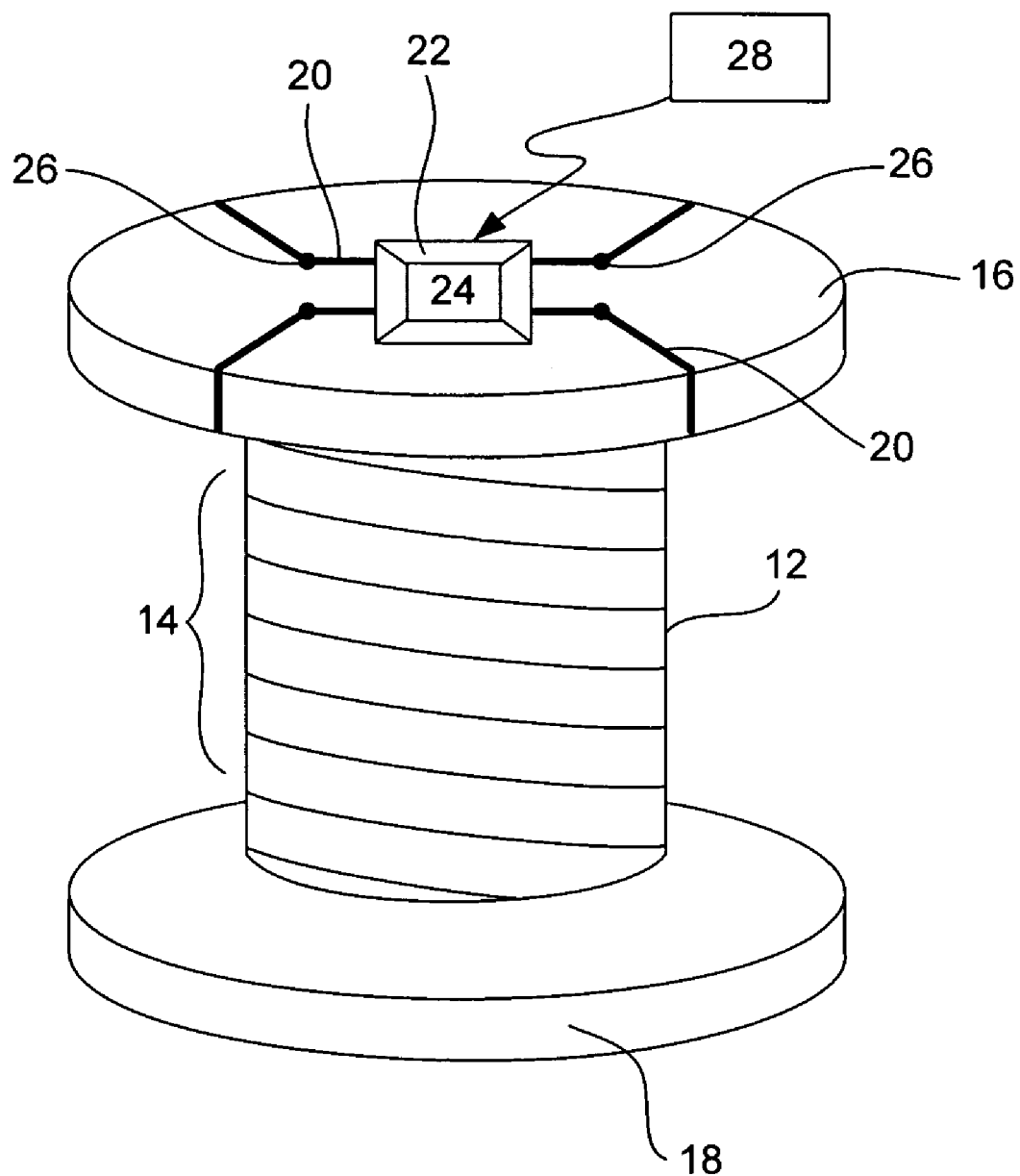
FIG. 2 is a second view of the inductor according to the present invention.

Referring to FIG. 2, a second view of the inductor 10 according to the present invention is shown. In this view, the inductor 10 is shown upside down so that the bottom surface of the base 16 is visible. Within the bottom surface of the base 16, a recess 22 is formed. A semiconductor die 24 is positioned within the recess 22. The traces 20 are in electrical contact with the integrated circuit die 24 using any of a number of well known semiconductor packaging techniques. A number of contacts 26 are also formed on the bottom surface of the base 16. The contacts 26, which are in electrical contact with the traces 20, are provided to electrically couple the wire 14 and integrated circuit die 24 with like contacts on a substrate (not illustrated), such as a printed circuit board, when the inductor 10 is mounted onto the substrate. As evident in FIGS. 1 and 2, some of the traces 20 wrap around the base 16 to contact the wire 14 wrapped around the magnetic core. Other traces 20 are only connected to the integrated circuit die and are used to provide power, ground, input and output signals to and from the die 24 and the substrate. An optional cover 28 is provided to flush mount to the bottom surface of the base 16 and to cover the die 24. In various embodiments, the cover is made from metal, plastic, ceramic or encapsulant.

In one specific embodiment, the cover can be made from a thermally conductive material. When the cover is in place, it is in contact with the die 24, acting as a heat sink. In an alternative embodiment, a heat sink or slug (not illustrated) can be positioned under the die 24 in the recess 22.

In yet another embodiment, the die 24 can be mounted on the base 16 or top surface 18 of the inductor 10. In various additional embodiments, the die can be either mounted directly on a surface of the inductor 10 or in a recess.

Figure 3:
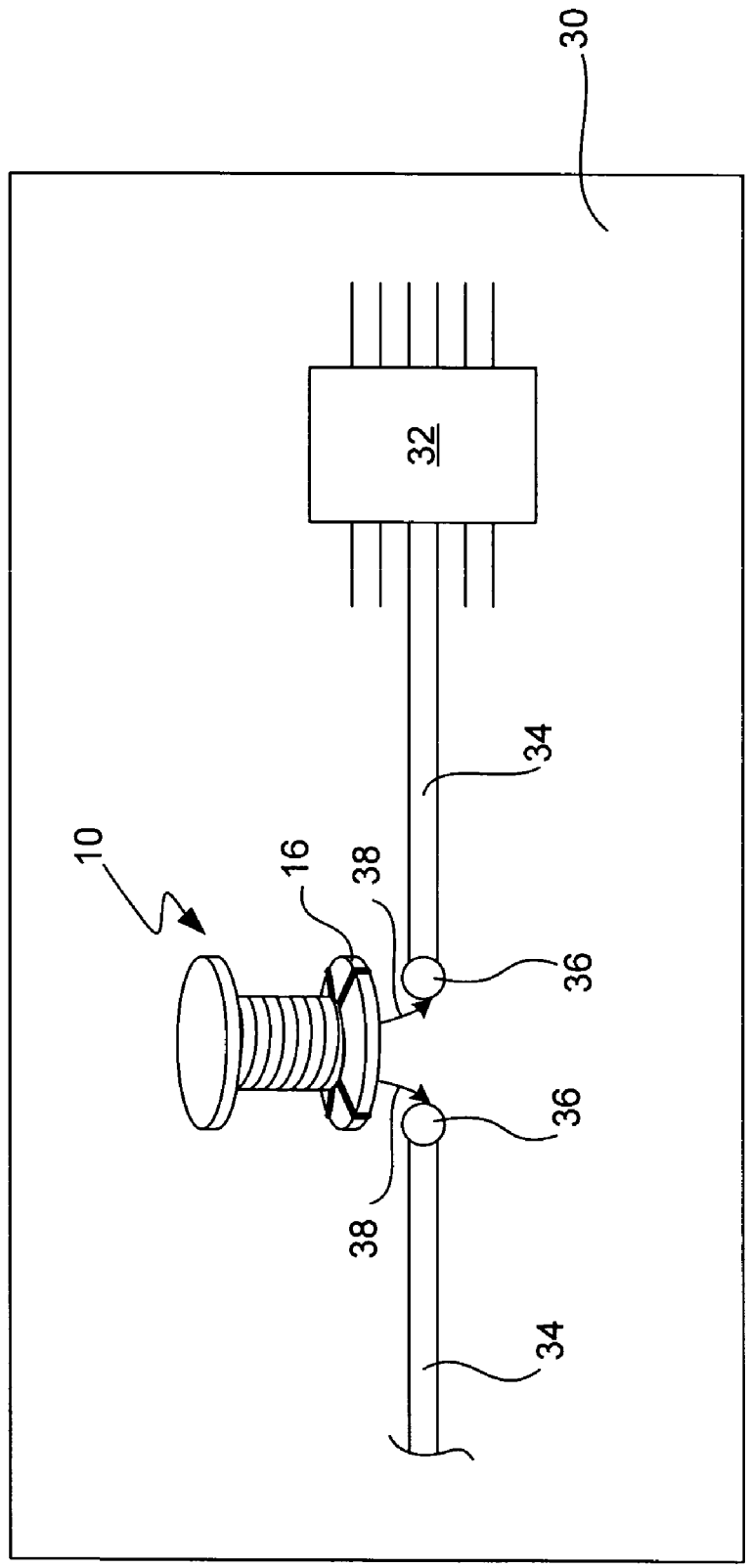
FIG. 3 is a diagram of the inductor of the present invention mounted onto a substrate, such as a printed circuit board.

Referring to FIG. 3, a diagram of the inductor 10 of the present invention mounted onto a substrate, such as a printed circuit board, is shown. The printed circuit board 30 includes one or more components 32 and the inductor 10 mounted onto the surface. As illustrated in the figure, the inductor 10 is mounted as indicated by arrows 38 so that the bottom surface of the base 16 is substantially flush with the surface of the substrate 30. In this manner, the contacts 26 on the bottom surface of the inductor 10 can form electromechanical bonds with contacts 36 formed on the substrate 30. Typically a solder paste is applied to the contacts 26 and/or contacts 36 on the board. The inductor 10 is then aligned and mounted onto the board 30. During a heating operation, the solder is reflowed, forming an electromechanical bond between the contacts 26 and 36. The integrated circuit 24 is therefore recessed within the inductor 10 and in electrical contact with the other components 32 on the substrate 30 through the traces 20, contacts 26 on the inductor 10 and the contacts 36 on the substrate 36.

Figure 4:
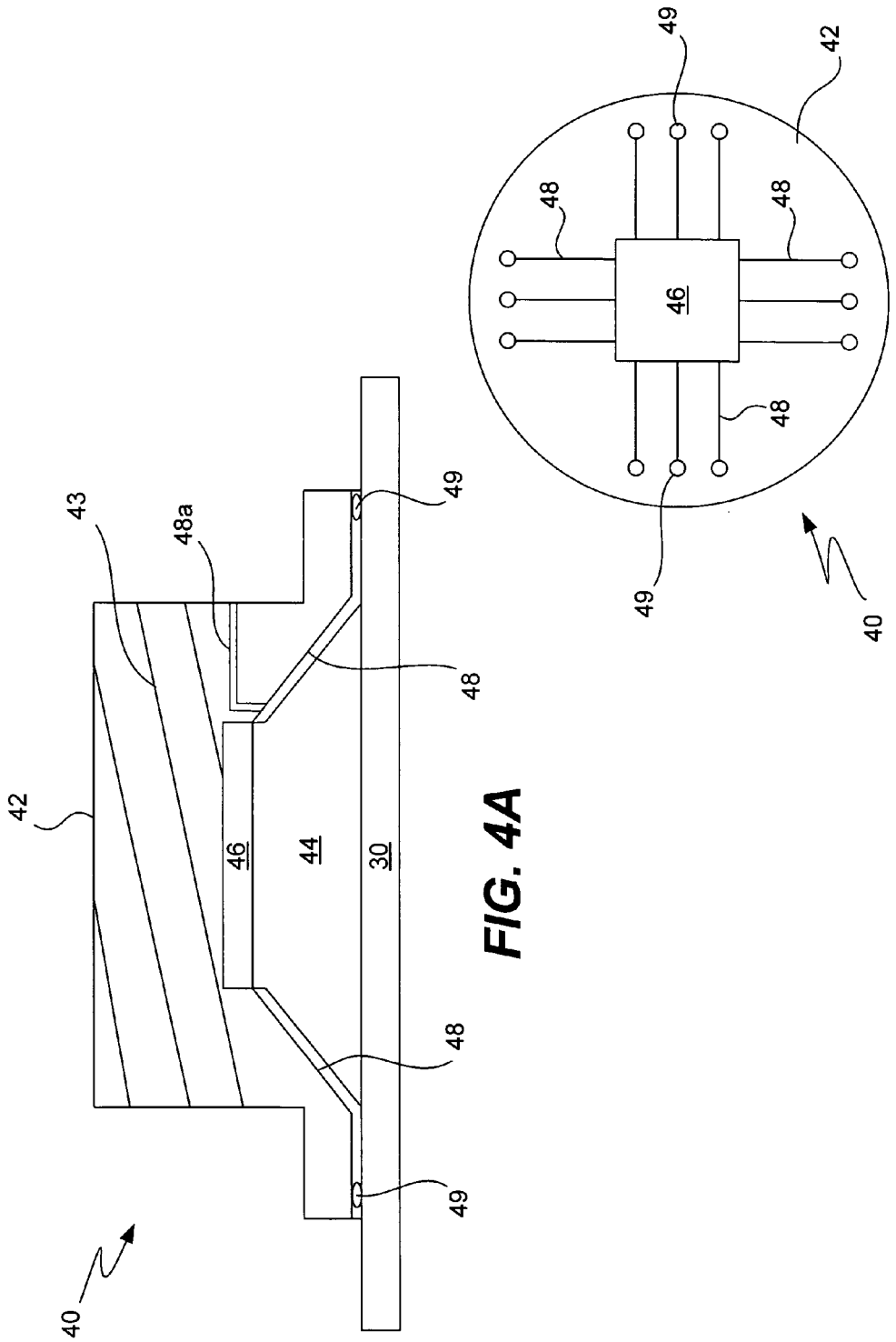
FIGS. 4A and 4B are diagrams of an inductor chip assembly according to one embodiment of the present invention.

Referring to FIGS. 4A and 4B, cross section and bottom view diagrams of an inductor chip assembly according to one embodiment of the present invention are shown respectively. In this embodiment, the inductor chip assembly 40 includes a magnetic core 42 and a wire 43 wrapped around the magnetic core 42. The magnetic core 42 includes a stepped recess region 44 formed under the bottom surface of the magnetic core 42. A semiconductor die 46, with its active surface facing down, is positioned within the step of the recess 44. Metal traces 48 within the recess 44 run between contacts 49 formed on the bottom surface of the magnetic core 42 in contact with the substrate 30 and the die 46. As evident in the Figure, the traces 48 travel up the inner sides of the recess 44 and terminate adjacent the active surface of the die 46. In this manner, the traces are in electrical contact with contacts around the perimeter of the active surface of the die 46. Any one of a number of well known packaging techniques may be used to form the electrical connections. Traces 48a are also formed through the magnetic core 42 and terminate adjacent the active surface of the die 46. The traces 48a are used to electrically couple the inductor wire 43 with the appropriate contacts on the die 46. In FIG. 4B, the bottom of the inductor chip assembly 40 is shown. In this view, the traces 48 are visible between the contacts 49 formed on the bottom surface of the magnetic core 42 and the die 46.

Figure 5:
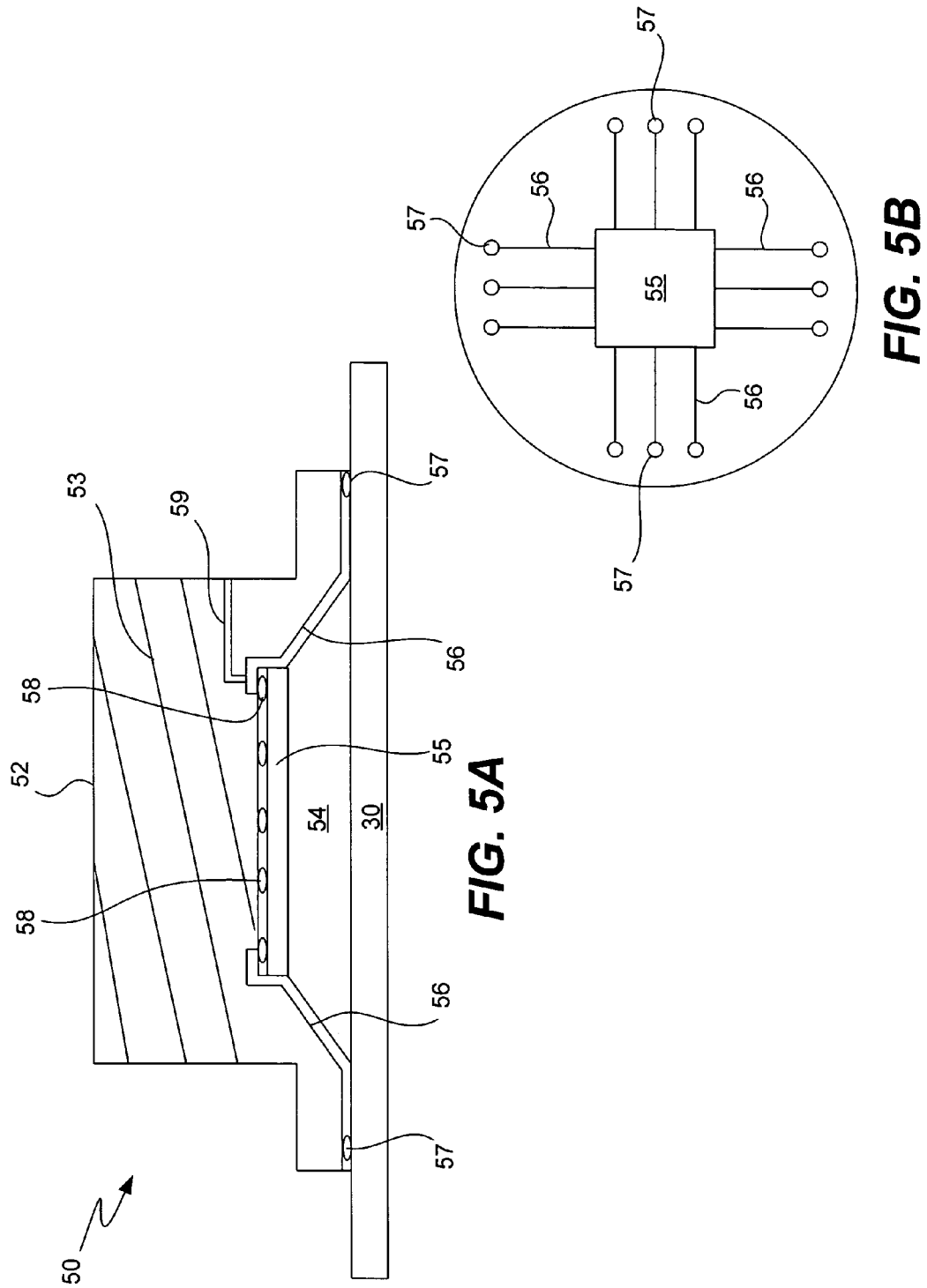
FIGS. 5A and 5B are diagrams of an inductor chip assembly according to another embodiment of the present invention.

Referring to FIGS. 5A and 5B, cross section and bottom view diagrams of an inductor chip assembly according to another embodiment of the present invention are shown respectively. In this embodiment, the inductor chip assembly 50 includes a magnetic core 52 and an inductor wire 53 wrapped around the magnetic core 52. The magnetic core 52 includes a recess region 54 formed under the bottom surface of the magnetic core 52. A micro SMD semiconductor die 55, with its active surface facing upward, is positioned within the upper region of the recess 54. Metal traces 56 form electrical connections between contacts 57 formed between the substrate 30 and the bottom surface of the metal core 52 and contacts 58 formed between the micro SMD die and the magnetic core 52. As evident in the Figure, the traces 56 travel up the inner sides of the recess 54 and terminate above the active surface of the micro SMD die 55. The micro SMD die is therefore in electrical contact with the substrate 30. Traces 59 are also formed through the magnetic core 52 and terminate adjacent contacts 58. The traces 59 are thus used to electrically couple the wire 53 with the appropriate contacts on the micro SMD die 55. In FIG. 5B, the bottom of the inductor chip assembly 50 is shown. In this view, the traces 56 are visible between the contacts 57 formed on the bottom surface of the magnetic core 52 and the micro SMD die 55. For more information on micro SMD packages, see National Semiconductor's Application Note 1112, December 2004, entitled Micro SMD Wafer Level Chip Scale Package, incorporated herein for all purposes.

Figure 6:
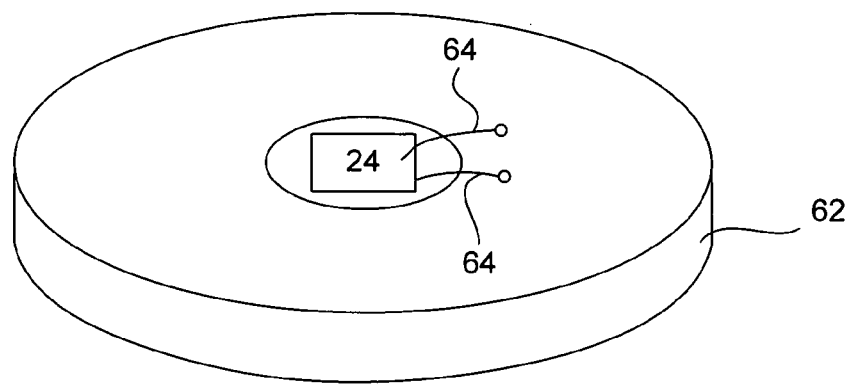
FIG. 6 is a diagram of a chip mounted onto a toroidal transformer according to another embodiment of the present invention.

Referring to FIG. 6, another embodiment of the present invention is shown. In this embodiment, a die 24 is mounted in the center region of a toroidal transformer 62. Wires 64 are provided to electrically couple leads on the toroidal transformer with the die 24. In various other embodiments, the standard wire wound transformers used for either stepping voltages up or down.

Figure 7A:
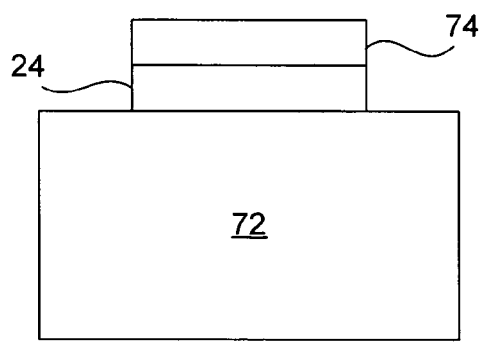
FIGS. 7A and 7B are diagrams of a chip and heat sink mounted onto an inductor or transformer according to additional embodiments of the present invention.
Figure 7B:
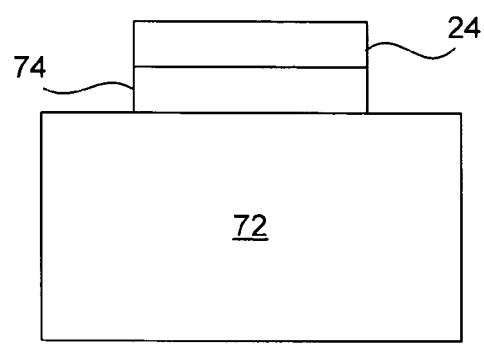

Referring to FIGS. 7A and 7B, yet other embodiments of the present invention are illustrated. In this embodiment, a die 24 is mounted directly onto the body of an inductor or a transformer 72. A heat sink 74 is then mounted on top of the die 24. The heat sink may be made of any thermally conductive material such as metal. FIG. 8B shows a similar arrangement except the heat sink 74 is provided between the die and the inductor or transformer 72. In yet other embodiments, the die can be positioned within a recess formed within the inductor or transformer 72.

For the purposes of this invention, the term wire should be broadly construed to cover all types of conductive wire, such as round flat or a conductive foil.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. An apparatus, comprising:
an inductor having a magnetic core and a wire wrapped around the magnetic core, the core having a recess therein;
an integrated circuit die positioned in and supported by the recess in the magnetic core of the inductor such that the integrated circuit is supported by the magnetic core;
a plurality of electrical traces formed on the magnetic core, wherein at least one of the electrical traces is configured to electrically couple the wire of the inductor with the integrated circuit die positioned on the inductor; and
a plurality of exposed contacts formed on the magnetic core that are suitable for electrical connection to an external device, wherein the contacts and the recess are formed on a first surface of the magnetic core and wherein a selected plurality of the electrical traces are configured to help electrically couple the integrated circuit die to associated ones of the exposed contacts without involving the wire wrapped around the magnetic core.

2. The apparatus of claim 1, further comprising a cover configured to cover the integrated circuit die positioned on the inductor.

3. The apparatus of claim 2, wherein the cover is made from one of the following materials: metal, plastic, ceramic, or encapsulant.

4. The apparatus of claim 1, wherein the inductor further comprises a base, the integrated circuit die being positioned within the base.

5. The apparatus of claim 1, further comprising contacts formed along the electrical traces, the contacts configured to electrically couple the integrated circuit die with second contacts formed on a substrate upon which the inductor is intended to be mounted.

6. The apparatus of claim 5, wherein the integrated circuit die is mounted within a step provided within a recess region formed in the magnetic core, the electrical traces terminating adjacent to the integrated circuit die such that the traces and contacts on the integrated circuit die are in electrical contact with one another.

7. The apparatus of claim 1, wherein the integrated circuit die is a micro SMD die.

8. The apparatus of claim 7, further comprising solder contacts to attach the micro SMD die to the magnetic core.

9. The apparatus of claim 8, wherein the traces are further configured to electrically contact the solder contacts used to attach the micro SMD die to the magnetic core.

10. The apparatus of claim 1, wherein the wire is one of the following types of wire: a round wire, a flat wire or an foil wire.

11. The apparatus of claim 1, wherein the inductor is a transformer.

12. The apparatus of claim 1, further comprising a heat sink mounted adjacent the integrated circuit die.

13. The apparatus of claim 12, wherein the integrated circuit die is provided between the magnetic core and the heat sink.

14. The apparatus of claim 12, wherein the heat sink is provided between the magnetic core and the integrated circuit die.

15. The apparatus of claim 1, wherein the integrated circuit die is positioned directly on the magnetic core.

16. The apparatus of claim 1, wherein the integrated circuit die is mounted on the magnetic core.

17. The apparatus of claim 1, wherein:
a solid portion of the magnetic core underlies the entire length of each of the selected plurality of the electrical traces.

18. An apparatus, comprising:
an inductor having a magnetic core and a wire wrapped around the magnetic core wherein the magnetic core has a top end having a top surface and an opposing bottom end having a bottom surface that is suitable for mounting on a substrate;
an integrated circuit die positioned on and supported by the bottom end of the magnetic core of the inductor, the magnetic core underlying the entire integrated circuit die such that the integrated circuit die does not extend beyond the periphery of the magnetic core;
a plurality of exposed contacts formed on the bottom surface of the magnetic core that are suitable for electrical connection to an external device, and
a plurality of core electrical traces formed on the magnetic core, wherein at least one of the core electrical traces electrically couples the inductor wire to the integrated circuit die and a selected plurality of the core electrical traces are configured to electrically couple the integrated circuit die to associated contacts formed on the bottom surface of the magnetic core; and
wherein the bottom surface of the magnetic core is arranged suitably for mounting on a substrate such that the exposed contacts formed on the bottom surface of the magnetic core electrically couple with corresponding selected substrate contacts in order to electrically couple the integrated circuit die with the substrate.

19. An apparatus comprising:
a substrate having substrate conductive traces and at least one electrical component;
an inductor having a magnetic core and a wire wrapped around the magnetic core, wherein the magnetic core has a top end having a top surface and an opposing bottom end having a bottom surface;
an integrated circuit die mounted on the bottom end of the magnetic core such that the integrated circuit die does not extend beyond the periphery of the magnetic core; and
a plurality of core electrical traces formed on the magnetic core, wherein at least one of the core electrical traces electrically couples the inductor wire to the integrated circuit die; and
wherein the bottom surface of the magnetic core is mounted on the substrate and at least some of the core electrical traces are electrically coupled with corresponding selected substrate electrical traces such that the integrated circuit die is electrically coupled with the one or more components on the substrate.

20. The apparatus of claim 19, wherein the core electrical traces are formed entirely on the magnetic core.

21. The apparatus of claim 20, wherein:
the integrated circuit die is positioned within a recess at the bottom end of the magnetic core and the depth of the recess is sufficient such that the integrated circuit die does not extend beyond the bottom surface of the magnetic core such that the integrated circuit does not directly contact the magnetic core; and
the die does not extend beyond the periphery of the magnetic core.

* * * * *